(12) United States Patent
Yamanaka

(10) Patent No.: US 6,359,921 B1
(45) Date of Patent: Mar. 19, 2002

(54) SEMICONDUCTOR LASER ELEMENT HAVING RESONATOR SURFACE COATED WITH OXYGEN GETTERING LAYER AND HIGH THERMAL CONDUCTIVITY LAYER

(75) Inventor: Fusao Yamanaka, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 0 days.

(21) Appl. No.: 09/650,636

(22) Filed: Aug. 30, 2000

(30) Foreign Application Priority Data

Aug. 30, 1999 (JP) .......................... 11-243113

(51) Int. Cl.[7] ................................ H01S 5/00
(52) U.S. Cl. ............................ 372/49; 372/46
(58) Field of Search ...................... 372/45, 46, 49

(56) References Cited

U.S. PATENT DOCUMENTS

| | | | |
|---|---|---|---|
| 4,656,638 A | 4/1987 | Tihanyi et al. | 372/49 |
| 5,063,173 A | 11/1991 | Gasser et al. | 437/129 |
| 5,900,640 A | 5/1999 | Ogura | 250/583 |
| 5,943,356 A * | 8/1999 | Kawai | 372/49 |
| 6,249,534 B1 * | 6/2001 | Itoh et al. | 372/49 |
| 6,252,254 B1 * | 6/2001 | Soule et al. | 257/89 |

FOREIGN PATENT DOCUMENTS

| | | | |
|---|---|---|---|
| EP | 0 834 971 A1 | 4/1998 | H01S/3/085 |
| JP | 2-288287 | 11/1990 | H01S/3/18 |
| JP | 3-142892 | 6/1991 | H01S/3/18 |
| JP | 9-162496 | 6/1997 | H01S/3/18 |
| JP | 10-3134 | 1/1998 | G03B/42/02 |
| WO | 97/10630 | 3/1997 | H01S/3/19 |

OTHER PUBLICATIONS

Patent Abstract of Japan 02–288287 Nov. 28, 1990.
Patent Abstract of Japan 03–142892 Jun. 18, 1991.
Patent Abstract of Japan 09–162496 Jun. 20, 1997.
Japanese Abstract No. 03142892, dated Jun. 18, 1991.
Japanese Abstract No. 10154844, dated Jun. 9, 1998.

* cited by examiner

Primary Examiner—James W. Davie
Assistant Examiner—Cecil B Harmon
(74) Attorney, Agent, or Firm—Sughrue Mion, PLLC (57) ABSTRACT

In a semiconductor laser element including a multilayered structure being formed of a plurality of semiconductor layers made of a plurality of group III–V compounds, and having at least a pair of cleaved end surfaces as a pair of light resonator surfaces, a first reflectance control layer, made of an oxygen gettering material which has a function of gettering oxygen, is formed on at least one of the pair of light resonator surfaces, and a second reflectance control layer made of a nitride of a group III material is formed on the first reflectance control layer.

20 Claims, 10 Drawing Sheets

SEMICONDUCTOR LASER ELEMENT HAVING RESONATOR SURFACE COATED WITH OXYGEN GETTERING LAYER AND HIGH THERMAL CONDUCTIVITY LAYER

BACKGROUND OF THE INVENTION

1. Field of the Invention

The present invention relates to a semiconductor laser element in which a light exit end surface is coated with a reflectance control layer which has high thermal conductivity. The present invention also relates to a process for producing such a semiconductor laser element.

2. Description of the Related Art

In the conventional semiconductor laser devices, the rise in temperature of a resonator surface during a high output power operation is considered to be a limiting factor of the maximum optical output, since a current which does not contribute to light emission is generated due to recombination at a surface of semiconductor layers corresponding to the resonator surface.

In order to solve the above problem, coating of the resonator surface with a group III nitride having high thermal conductivity is proposed. However, researchers belonging to the present assignee have found that the thermal conductivity seriously decreases due to oxygen capture by the group III nitride, and therefore the coating of the group III nitride does not function as desired.

The following patent publications disclose examples of coatings of the resonator surfaces.

(i) Japanese Unexamined Patent Publication No. 3(1991)-142892 discloses that reliability of semiconductor laser devices increases when resonator surfaces of the semiconductor laser devices are directly coated with AlN which has high thermal conductivity. However, the oxygen content in the AlN coating is not limited. Therefore, the high thermal conductivity may not be maintained during actual use of the semiconductor laser devices.

(ii) Japanese Unexamined Patent Publication No. 9(1997)-162496 discloses formation of nitrides of Al, Si, Ta, V, Sb, Mn, or Cr coating having a thickness of 0.5 to 10 nm on resonator surfaces. However, no disclosure is provided for oxygen concentration in the nitrides.

(iii) U.S. Pat. No. 5,063,173 discloses formation of $Si_3N_4$ coating on Si coating. However, since the thermal conductivity of $Si_3N_4$ is inherently low (i.e., 40 W/m·K or lower), characteristics of semiconductor laser devices are not substantially affected by the oxygen capture when the resonator surfaces are coated with $Si_3N_4$.

(iv) U.S. Pat. No. 4,656,638 discloses formation of a metal layer having a thickness of 10 nm or less on an end surface of a semiconductor laser element, and formation of a reflectance control layer, made of an oxide such as $Al_2O_3$, on the metal layer, where the metal layer is made of, for example, Al, Si, Ta, V, Sb, Mn, Cr, or Ti. However, the thermal conductivity of $Al_2O_3$ is 11 to 25 W/m·K, which is one order lower than the thermal conductivity of the nitrides.

As mentioned above, conventionally, the reflectance control layers made of group III nitrides are formed on the light exit end surfaces of semiconductor laser elements for the purpose of enhancement of heat dissipation. However, the characteristics and reliability of the conventional reflectance control layers are not sufficient. In addition, control of oxygen concentrations of the group III nitrides is not performed.

SUMMARY OF THE INVENTION

An object of the present invention is to provide a semiconductor laser element having improved characteristics and reliability, where the semiconductor laser element has a light exit end surface coated with a reflectance control layer having high thermal conductivity.

Another object of the present invention is to provide a process for producing the semiconductor laser element having improved characteristics and reliability, where the semiconductor laser element has a light exit end surface coated with a reflectance control layer having high thermal conductivity.

According to the first aspect of the present invention, there is provided a semiconductor laser element comprising: a multilayered structure being formed of a plurality of semiconductor layers made of a plurality of group III–V compounds, and having at least a pair of cleaved end surfaces as a pair of light resonator surfaces; a first reflectance control layer formed on at least one of the pair of light resonator surfaces, and made of an oxygen gettering material which has a function of gettering oxygen; and a second reflectance control layer formed on the first reflectance control layer, and made of a nitride of a group III material.

Preferably, the first reflectance control layer has such a thickness that the second reflectance control layer has an oxygen concentration of 5 atomic percent (atm %) or below, where the "atomic percent (atm %)" is a percentage of atoms of an element of interest. Further preferably, the first reflectance control layer has such a thickness that the second reflectance control layer has an oxygen concentration of 3 atm % or below.

Since at least one of the pair of light resonator surfaces is coated with an oxygen gettering material which has a function of gettering oxygen, the oxygen gettering material in the first reflectance control layer can getter oxygen which is captured in the nitride of the group III material forming the second reflectance control layer. Therefore, it is possible to prevent the decrease in the thermal conductivity of the nitride of the group III material forming the second reflectance control layer, and the decrease in the maximum optical output due to heat generation at the light exit end surface during high output power operation of the semiconductor laser element. Thus, reliability of the semiconductor laser element can be increased. Further, when the second reflectance control layer has an oxygen concentration of 5 atm % or below (further preferably, 3 atm % or below), the thermal conductivity of the second reflectance control layer can be maintained high.

Furthermore, the semiconductor laser element according to the first aspect of the present invention may also have one or any possible combination of the following additional features (i) to (vii).

(i) The oxygen gettering material may be one or a mixture of group IV elements, one or a mixture of group V elements, or one or a mixture of other metallic elements.

(ii) The group IV elements may be Si and Ge.

(iii) The group V elements may be Sb and Bi.

(iv) In the case of (ii) or (iii), the thickness of the first reflectance control layer may be within a range of 0.2 nm and 50 nm.

(v) The other metallic elements may be Al, Ti, V, Ta, Cr, and Mn.

(vi) In the case of (v), the thickness of the first reflectance control layer may be within a range of 0.2 nm and 5 nm.

(vii) The group III material may be one or more of B, Al, In, and Ga.

According to the second aspect of the present invention, there is provided a process for producing a semiconductor laser element including a multilayered structure being formed of a plurality of semiconductor layers made of a plurality of group III–V compounds, and having a pair of cleaved end surfaces as a pair of light resonator surfaces, the process comprising the steps of: (a) forming a first reflectance control layer on at least one of the pair of light resonator surfaces, where the first reflectance control layer is made of an oxygen gettering material which has a function of gettering oxygen; and (b) forming a second reflectance control layer on at least one of the pair of light resonator surfaces, where the second reflectance control layer is made of a nitride of a group III material.

Preferably, the process according to the second aspect of the present invention may also have one or any possible combination of the following additional features (viii) and (ix).

(viii) The second reflectance control layer may be formed before the first reflectance control layer is oxidized.

(ix) The first and second reflectance control layers may be formed in a sputtering system which includes at least two evaporation sources, or in an evaporation system which includes at least two evaporation sources, or in a chemical vapor deposition system which is capable of forming at least two films.

When the first and second reflectance control layers are formed in a vacuum chamber, the first reflectance control layer is not oxidized. Therefore, it is possible to prevent the decrease in the thermal conductivity of the second reflectance control layer, and increase the maximum optical output power of the semiconductor laser element.

DESCRIPTION OF PREFERRED EMBODIMENTS

Embodiments of the present invention are explained in detail below with reference to drawings.

Formation of Layered Structure in First Embodiment

Figure 1:
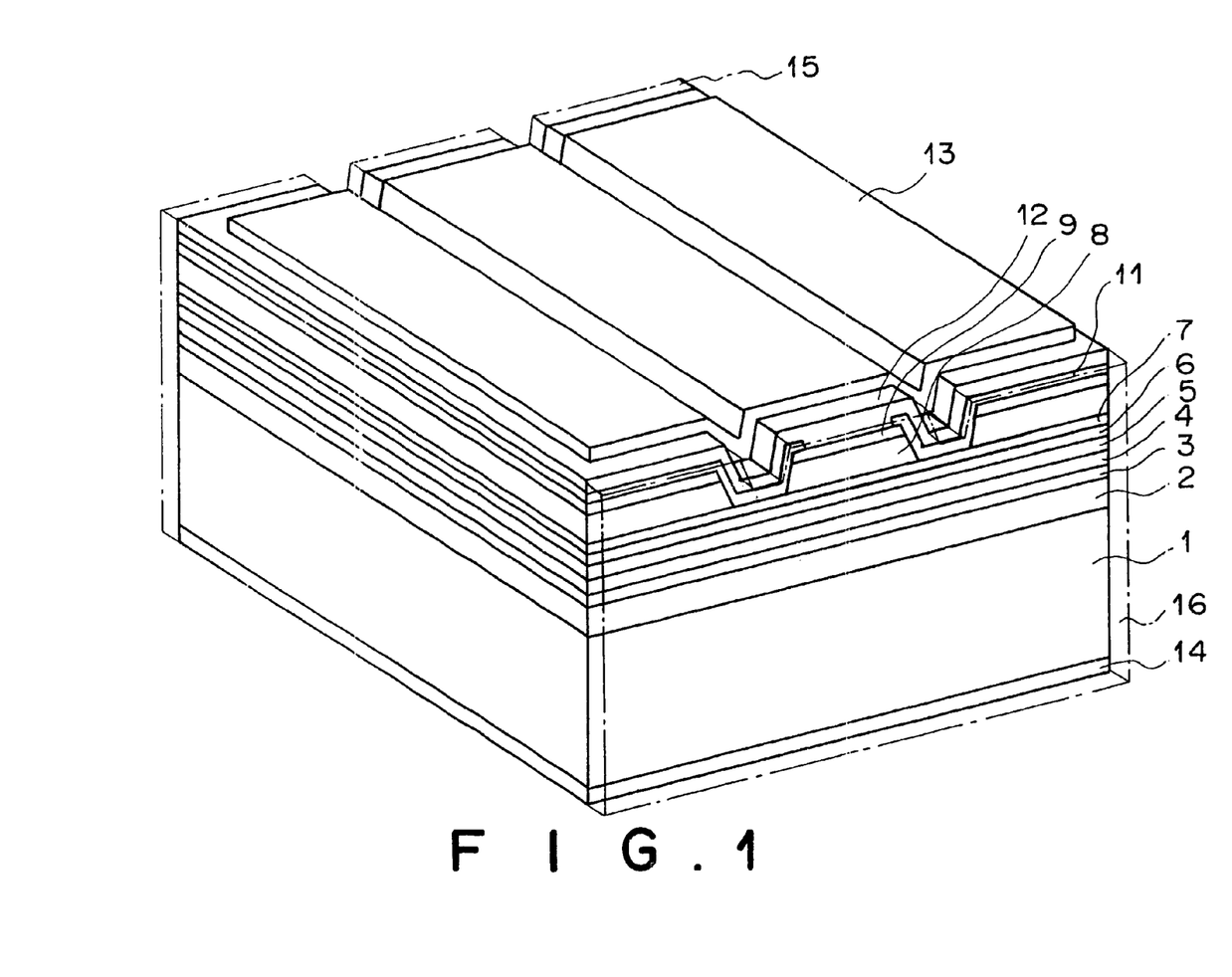
FIG. 1 is a perspective view of a semiconductor laser element as the first embodiment of the present invention.
Figure 2:
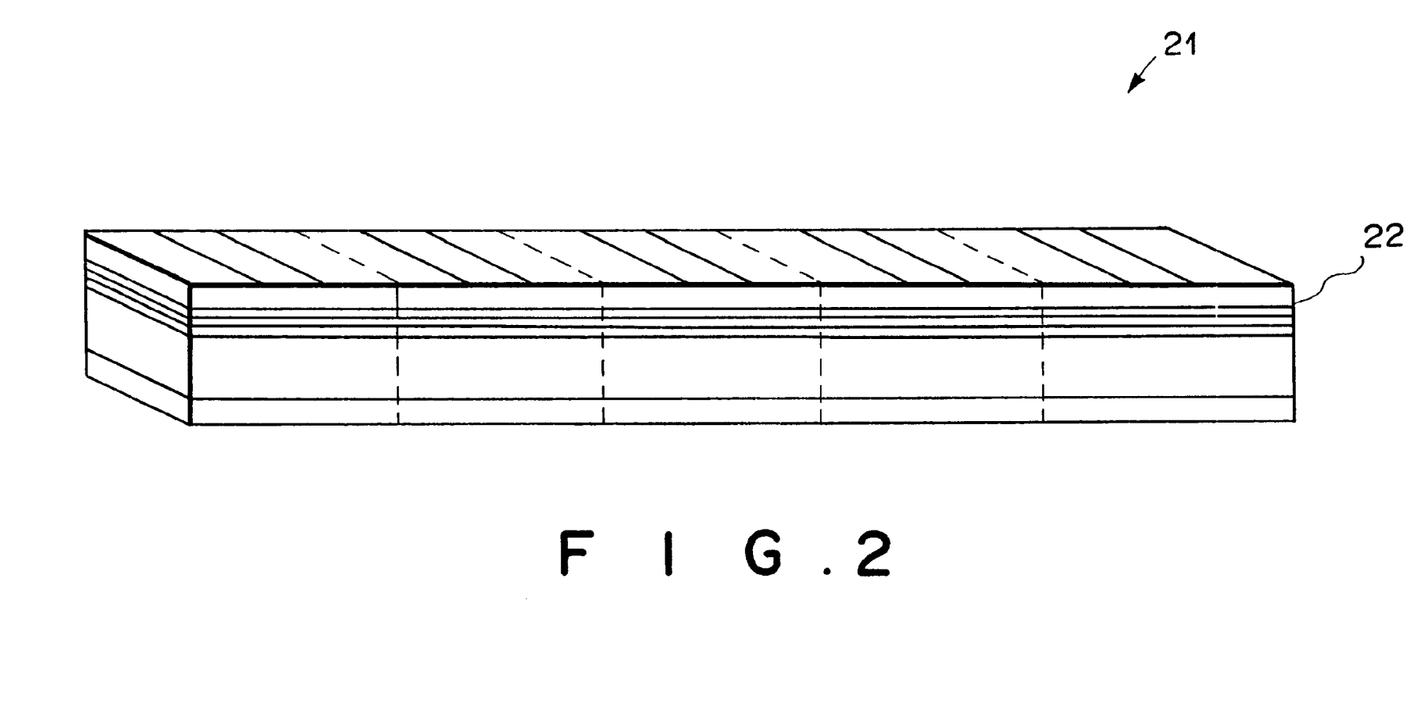
FIG. 2 is a perspective view of a bar in which a plurality of semiconductor laser elements are formed.

FIG. 1 is a perspective view of a semiconductor laser element as the first embodiment of the present invention. The construction of FIG. 1 corresponds to a single semiconductor laser element, which is obtained by cleaving a bar illustrated in FIG. 2 into pieces. In practice, a plurality of layered structures each corresponding to a semiconductor laser element are concurrently formed on a substrate. Then, the substrate on which the plurality of layered structures are formed is cleaved into a plurality of bars each of which has the construction as illustrated in FIG. 2.

However, for the sake of simplicity of illustration, the formation of the plurality of constructions on the substrate is explained below with reference to FIG. 1.

As illustrated in FIG. 1, an n-type $Ga_{1-z1}Al_{z1}As$ lower cladding layer 2 ($0.55 \leq z1 \leq 0.7$), an i-type (intrinsic) $In_{0.49}Ga_{0.51}P$ lower optical waveguide layer 3 having a thickness db of 110 nm, an $In_{x3}Ga_{1-x3}As_{1-y3}P_{y3}$ quantum well active layer 4 having a thickness da of 8 nm, an i-type $In_{0.49}Ga_{0.51}P$ upper optical waveguide layer 5 having a thickness db of 110 nm, a p-type $Ga_{1-z1}Al_{z1}As$ first upper cladding layer 6 having a thickness dc of 100 nm, a p-type $In_{0.49}Ga_{0.51}P$ etching stop layer 7, a p-type $Ga_{1-z1}Al_{z1}As$ second upper cladding layer 8, and a p-type GaAs contact layer 9 are formed on an n-type GaAs substrate 1 by organometallic vapor phase epitaxy. Then, a $SiO_2$ insulation film 10 (not shown) is formed over the layered structures formed as above.

Thereafter, a ridge stripe structure having a width of about 30 to 250 μm is formed as follows. First, two stripe areas of the $SiO_2$ insulation film 10, located on both sides of the ridge stripe structure, are removed by normal lithography, and then portions of the above layered structure under the two stripe areas are removed to the depth of the upper boundary of the p-type $In_{0.49}Ga_{0.51}P$ etching stop layer 7, by wet etching using the above $SiO_2$ insulation film 10 as a mask and a solution of sulfuric acid and hydrogen peroxide as an etchant. Due to the use of the solution of sulfuric acid and hydrogen peroxide as an etchant, the wet etching automatically stops at the upper boundary of the p-type $In_{0.49}Ga_{0.51}P$ etching stop layer 7.

Next, the remaining portions of the $SiO_2$ insulation film 10 film are removed, and then another $SiO_2$ insulation film 11 is formed over the entire surface of the above layered structure. Thereafter, a portion of the $SiO_2$ insulation film 11 located on the top of the ridge stripe structure is removed along the ridge stripe so as to form a current injection window. Then, a p electrode 12 is formed over the entire surface of the current injection window, and the p electrode 12 is coated with Au plating 13 having a thickness of 5 μm or more. Finally, the bottom surface of the n-type GaAs substrate 1 is polished so as to reduce the thickness of the n-type GaAs substrate 1 to 100 to 150 μm, and an n electrode 14 is formed on the polished surface.

Each layer in the layered structure illustrated in FIG. 1 may be formed by molecular beam epitaxy using solid or gas raw material.

Although an n-type GaAs substrate is used in the layered structure illustrated in FIG. 1, instead, p-type GaAs substrates may be used. When the GaAs substrate is a p-type, the conductivity types of all of the other layers in the layered structure illustrated in FIG. 1 should be inverted.

The wavelength λ of light emitted by the semiconductor laser element of FIG. 1 can be controlled in the range between 750 and 1,100 nm by appropriately adjusting the composition of the $In_{x3}Ga_{1-x3}As_{1-y3}P_{y3}$ quantum well active layer 4 ($0 \leq x3 \leq 0.4$, $0 \leq y3 \leq 0.6$).

In this example, 809 nm is chosen as the oscillation wavelength. In addition, the stripe width of the above ridge stripe structure is 50 μm, and the compositions of the quantum well active layer 4 and the cladding layers 2, 6, and 8 are chosen such that z1=0.64, x3=0.12, and y3=0.24.

The resonator length is in the range of 0.75 to 2.5 mm, and preferably in the range of 0.9 to 1.5 mm.

As described before, the substrate on which the plurality of layered structures are formed as explained with reference to FIG. 1 are cleaved into a plurality of bars 21 each of which has the construction as illustrated in FIG. 2. In this embodiment, the substrate on which the plurality of layered structures are formed is cleaved, in the atmosphere, along such a direction that the (100) face of the GaAs substrate is exposed as light exit end surfaces 22 of the plurality of semiconductor laser elements in the bar 21.

Coating of Light Exit End Surface

Figure 3:
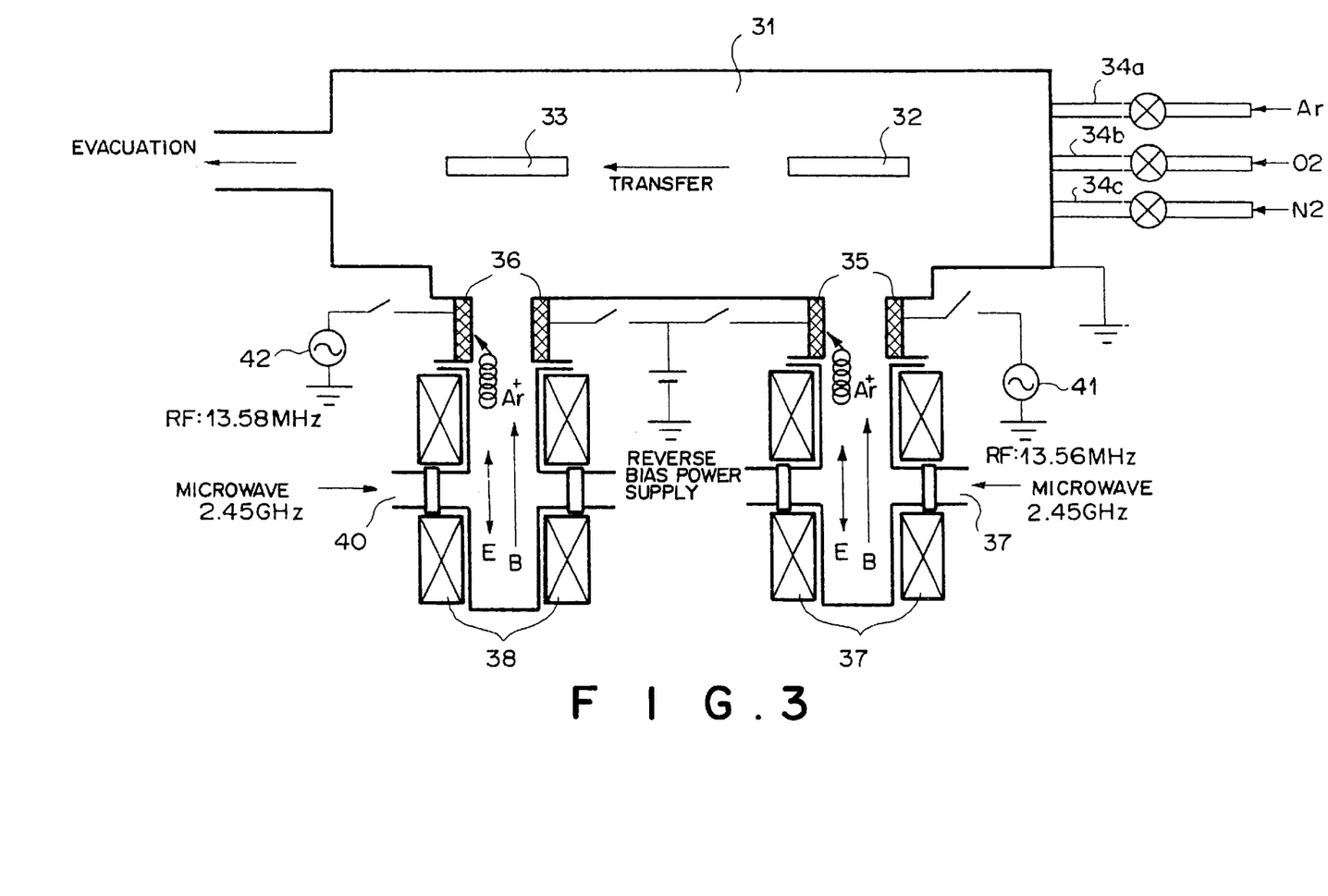
FIG. 3 is a diagram illustrating an ECR (electron cyclotron resonance) sputtering system.

The bar 21 obtained as above is fixed to a jig in the atmosphere for coating of the light exit end surfaces 22, and the jig is set on a sample table 32 in an ECR (electron cyclotron resonance) sputtering system as illustrated in FIG. 3. Then, the ECR sputtering system is evacuated.

The ECR sputtering system of FIG. 3 comprises a vacuum chamber 31, gas introduction tubes 34a, 34b, and 34c, a silicon target 35, an aluminum target 36, electromagnetic coils 37 and 38, waveguides 39 and 40, and RF power supplies 41 and 42, where sample tables 32 and 33 are arranged in the vacuum chamber 31, and each of the gas introduction tubes 34a, 34b, and 34c is provided with a valve.

The gas introduction tubes 34a, 34b, and 34c are provided for introducing gases into the vacuum chamber 31, and the electromagnetic coils 37 and 38 are provided for accelerating ion beams toward the targets 35 and 36 so that atoms of the targets sputtered by the accelerated ion beams are deposited on the sample. The purities of the silicon target 35 and the aluminum target 36 are 99.999% or more.

When the degree of vacuum in the vacuum chamber 31 reaches $10^{-4}$ Pa or below, the pressure of argon gas is set within the range of 0.8 to $1.1 \times 10^{31\ 1}$ Pa, and then the argon gas is introduced through the gas introduction tube 34a into the vacuum chamber 31, and a Si film having a thickness of about 10 nm is formed on the light exit end surfaces 22 of the semiconductor laser elements in the bar 21, by using the silicon target 35. Subsequently, the sample is transferred from the sample table 32 to the sample table 33. Then, the ratio of flow rates of $N_2$ and Ar is set within the range of 0.1 to 0.25, and the total pressure is set within the range of 0.8 to $1.1 \times 10^{-1}$ Pa. Under these conditions, an AlN film having a thickness corresponding to λ/2 is formed on the Si film by using the target 36 so as to realize a reflectance of 32% at the light exit end surfaces 22, where λ=809 nm. In addition, the opposite end surfaces of the semiconductor laser elements in the bar 21 are coated with multiple oxide layers, each having a thickness corresponding to λ/4, so as to realize a reflectance of 95% at the opposite end surfaces. For example, the multiple oxide layers are realized by forming $Al_2O_3$ and $SiO_2$ layers five times.

After the light exit end surfaces 22 and the opposite end surfaces are coated as above, the bar 21 is cleaved into semiconductor laser elements each having a width of 500 to 600 μm. Then, the p side of the semiconductor laser element is bonded to a heatsink by heating the heatsink to the temperature range of 180 to 220° C. and fusing an In layer formed on the heatsink, where the In layer has a thickness of 3.5 to 5.5 μm. The heatsink is produced by coating an entire upper surface of a Cu base with Ni plating having a thickness of about 5 μm, and further forming, on the Ni plating, a Ni layer having a thickness of 50 to 150 nm, a Pt layer having a thickness of 50 to 200 nm, and the above In layer in this order by evaporation.

Advantages

Figure 4:
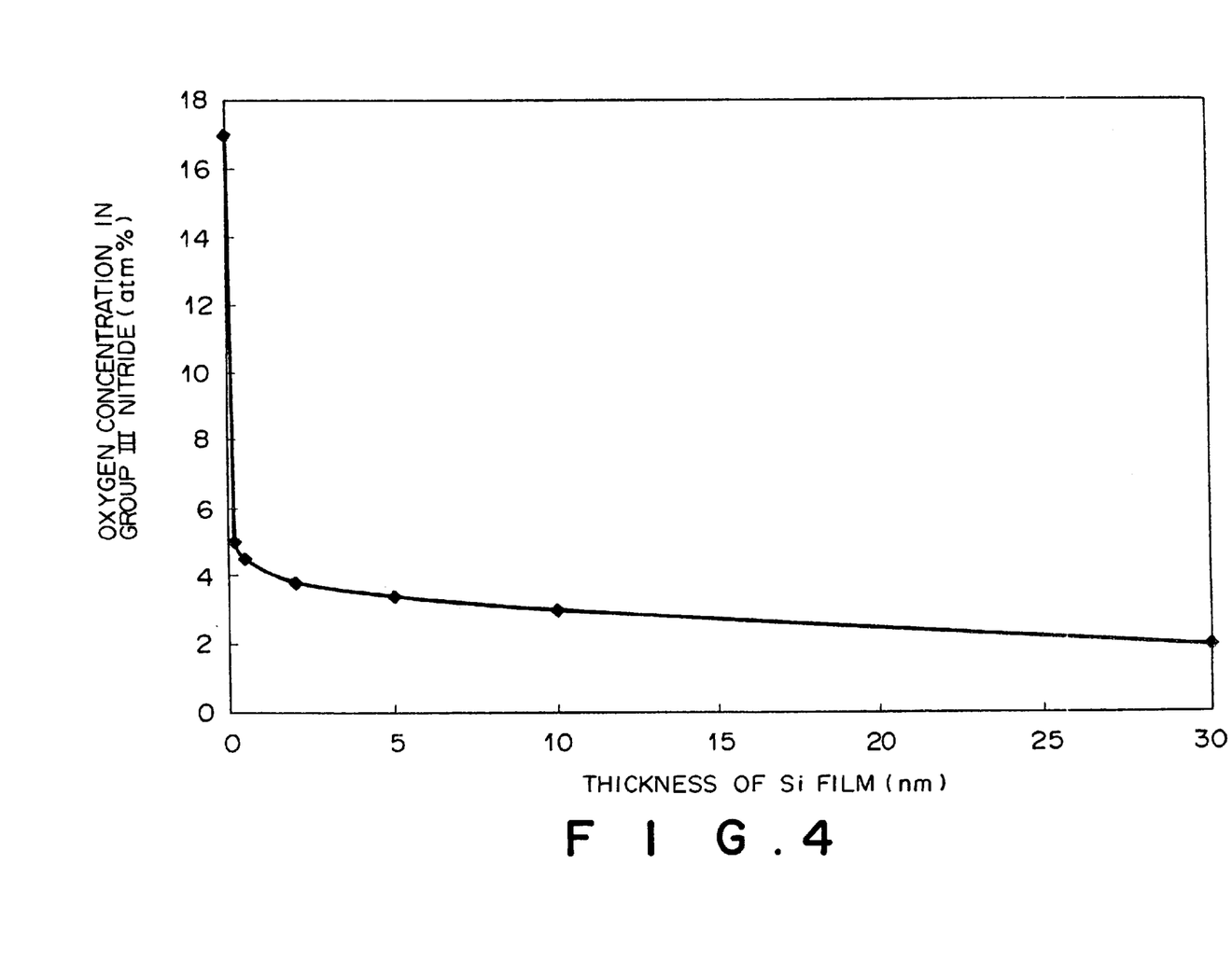
FIG. 4 is a graph indicating a relationship between the thickness of a Si film and an oxygen concentration in a group III nitride film formed on the Si film.

FIG. 4 is a graph indicating a relationship between the thickness of a Si film and an oxygen concentration in a group III nitride film formed on the Si film. As illustrated in FIG. 4, it is possible to control the oxygen concentration in the group III nitride reflectance control layer to a desired level, i.e., below 5 atm %, by forming a Si film to an appropriate thickness according to a residual oxygen concentration in a film forming apparatus in which the Si film is formed, where the maximum thickness of the Si film is about 50 nm. If the residual oxygen concentration is high, and the film containing the gettering element is too thin for the residual oxygen concentration, the gettering by the Si film becomes insufficient, and the group III nitride holds more than a desirable amount of oxygen.

Figure 5:
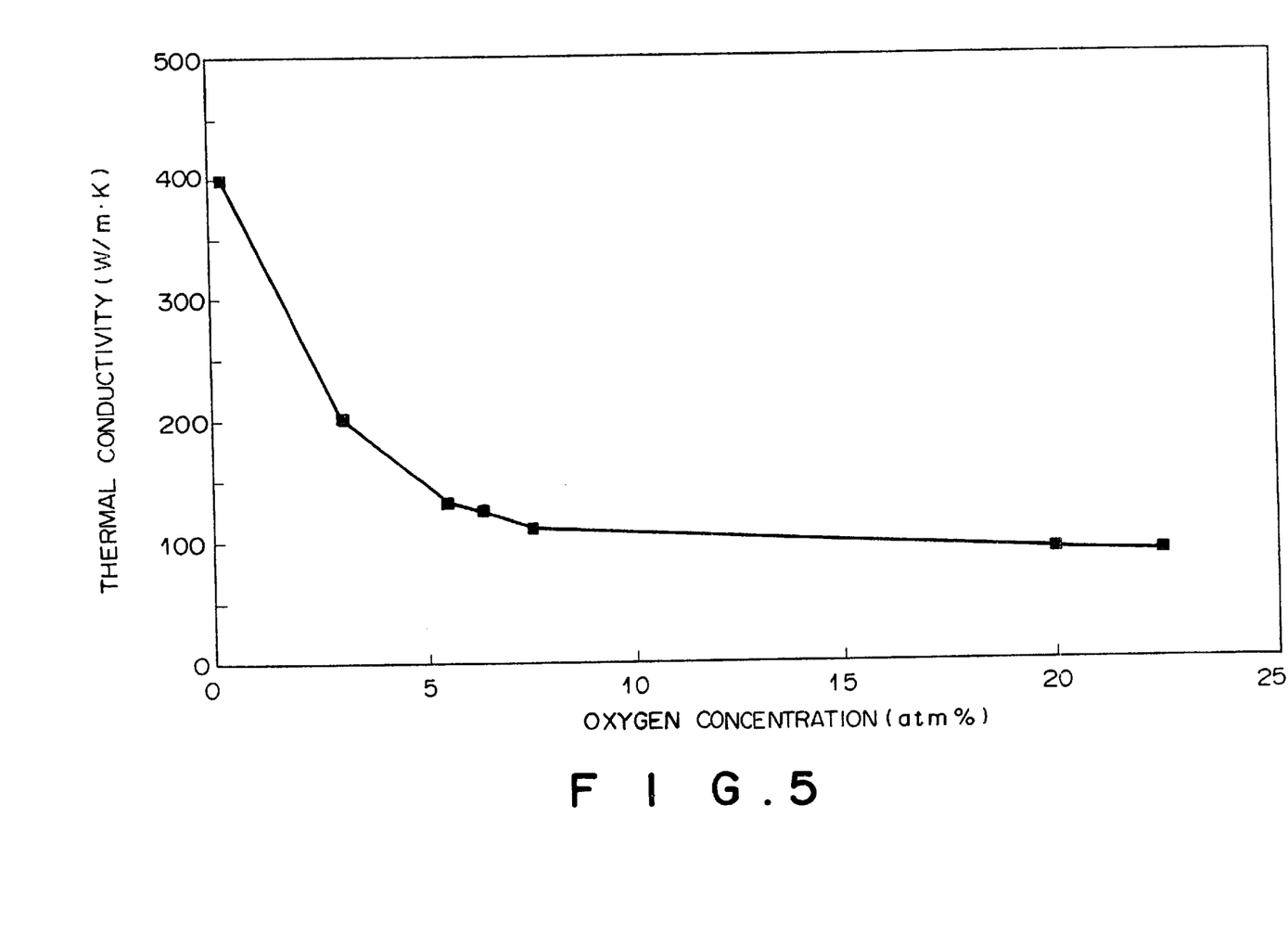
FIG. 5 is a graph indicating a relationship between the thermal conductivity and the oxygen concentration in an AlN film.

In order to investigate dependence of the thermal conductivity of the AlN film on the oxygen concentration in the AlN film, $AlO_xN_{1-x}$ films of various values of x ($0 \leq x \leq 1$) are formed on resonator surfaces of a plurality of semiconductor laser elements by using an Al target and appropriately adjusting the partial pressures of Ar, $O_2$, and $N_2$ during the sputtering process. The obtained dependence is indicated in FIG. 5. That is, FIG. 5 exhibits a relationship between the thermal conductivity and the oxygen concentration in the AlN film. The present inventor has confirmed that the thermal conductivity of the AlN film seriously decreases when the oxygen concentration in the AlN film exceeds 5 atm %, as illustrated in FIG. 5.

Oxygen is captured by the AlN films during the formation of the AlN film due to residual oxygen which is physically absorbed by the above-mentioned jig and residual gas components existing in the vacuum chamber. The oxygen capture by the AlN films is caused by evaporation molecules, hot electrons, ions, and the like, which are scattered during the film forming operation. The decrease in the thermal conductivity due to oxygen capture is also observed in other group III nitride films.

In order to prevent capture of the residual oxygen, according to the present invention, a film containing an element which can getter oxygen is formed on the resonator surface before formation of the group III nitride film. Therefore, the residual oxygen physically absorbed by the jig, and oxygen in the residual gas in the vacuum chamber are captured by the element which getters oxygen before formation of the group III nitride film, and then that element can also capture oxygen included in the group III nitride during formation of the group III nitride film. Thus, the oxygen contained in the group III nitride film can be reduced, and therefore the high thermal conductivity which the group III nitride inherently has can be maintained in the group III nitride film.

Next, depth profiles of the semiconductor laser element as the first embodiment and another semiconductor laser element in which the resonator surface is coated with only an AlN film are obtained for various elements N, O, Al, Si, Ga, and As by measurement of N1s, O1s, Al1s, Si2p, Ga3d, and As3d peaks. The measurement is performed by XPS (X-ray photoelectron spectrometry). The details of the measurement conditions are indicated in Table 1a. In order to obtain the depth profiles, the concentrations of the elements are respectively obtained by calculating areas of the N1s, O1s, Al1s, Si2p, Ga3d, and As3d peaks in the corresponding ranges of the binding energies in the spectrum, and using the Shirley-type background subtraction method. The ranges of the binding energies corresponding to the N1s, O1s, Al1s, Si2p, Ga3d, and As3d peaks are indicated in Table 1b.

TABLE 1a

XPS Measurement Condition (1) Measuring Equipment: QUANTUM 2000, manufactured by Physical Electronics Inc.
(2) Measurement Condition
   (a) Excitation x-ray: Monochromatic x-ray (AlK α1: 1486.6 eV) generated when an electron beam with a beam diameter of 100 μm and power of 44 W is incident on an Al target.
   (b) Analysis Area: 100 μmφ.
   (c) Takeoff Angle: 45 degrees.
   (d) Pass Energy: 11.75 eV.
   (e) Step Width: 0.1 eV.
(3) Etching Condition
   (a) Accelerating Energy: 0.8 eV.
   (b) Etching Rate: 2 nm/min.(in the case of $SiO_2$.

TABLE 1b

Ranges of Binding Energies of Elements

| Photoelectron Peak | Range of Binding Energy |
| --- | --- |
| O1s | 526–537 eV |
| Ga3d | 15–25 eV |
| As3d | 38–46 eV |
| N1s | 391–402 eV |
| Al2p | 69–80 eV |
| Si2p | 96–106 eV |

Figure 6:
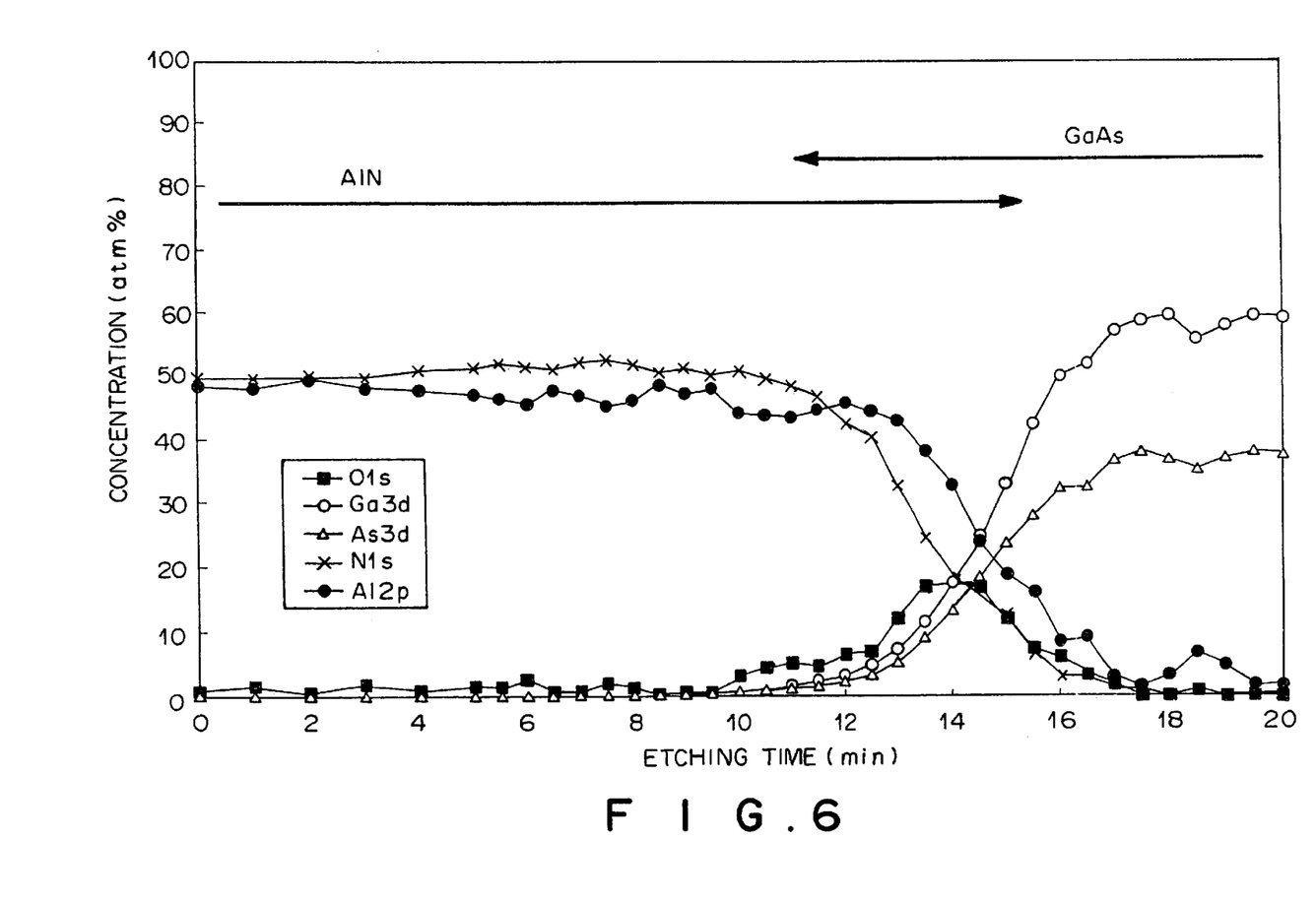
FIG. 6 is a graph indicating variations of concentrations of various elements contained in an AlN film with an etching time corresponding to a depth from a resonator surface toward semiconductor layers, in the case where the end surface of the semiconductor layers is coated with only the AlN film.
Figure 7:
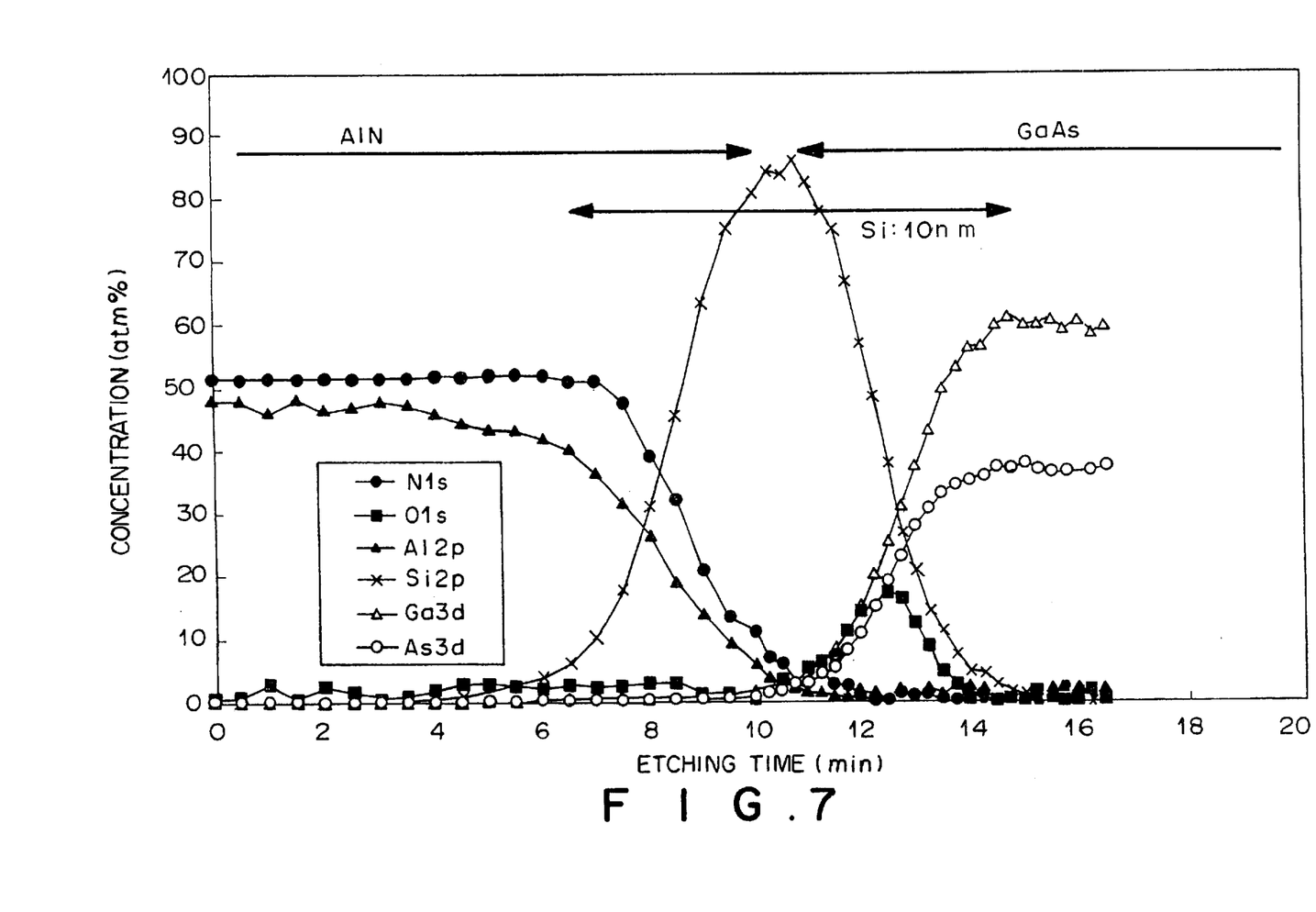
FIG. 7 is a graph indicating variations of concentrations of various elements contained in an AlN film with an etching time corresponding to a depth from the resonator surface toward the semiconductor layers, in the case where the resonator surface of the semiconductor layers is coated with a Si film and the AlN film.

The results of the above measurement are indicated in FIGS. 6 and 7. FIG. 6 is a graph indicating variations of concentrations of various elements contained in an AlN film with an etching time corresponding to a depth from the resonator surface toward the GaAs layers, in the case where the end surface of the semiconductor layers is coated with only the AlN film. In FIG. 6, the boundary between the AlN film and the GaAs layer corresponds to the etching time of about 11 to 15 minutes. The number of oxygen atoms bonded to the AlN film or the GaAs layers, which is indicated by the filled squares in FIG. 6, increases around the etching time of 14 minutes. That is, the number of oxygen atoms bonded to the AlN film or the GaAs layers increases around the boundary between the AlN film and the GaAs layers, and the oxygen concentration exceeds 15 atm % around the boundary between the AlN film and the GaAs layers.

FIG. 7 is a graph indicating variations of concentrations of various elements contained in an AlN film with an etching time corresponding to a depth from the resonator surface toward the semiconductor layers, in the case where the resonator surface of the semiconductor layers is coated with a Si film and the AlN film. In FIG. 7, the boundary between the AlN film and the Si film corresponds to the etching time of about 6 to 10 minutes, and the boundary between the AlN film and the GaAs layer corresponds to the etching time of about 11 to 14 minutes. As illustrated in FIG. 7, the number of oxygen atoms bonded to the AlN film is small through the entire thickness of the AlN film, although the number of oxygen atoms increases around the boundary between the AlN film and the GaAs layers.

That is, when the Si film is not formed, the oxygen is bonded to aluminum, and when the Si film is formed between the AlN film and the GaAs film, the oxygen is bonded to silicon. Thus, when the Si film is formed between the AlN film and the GaAs film, the oxygen is bonded to the AlN film, and therefore the high thermal conductivity, which the AlN film inherently has, can be maintained.

Figure 8:
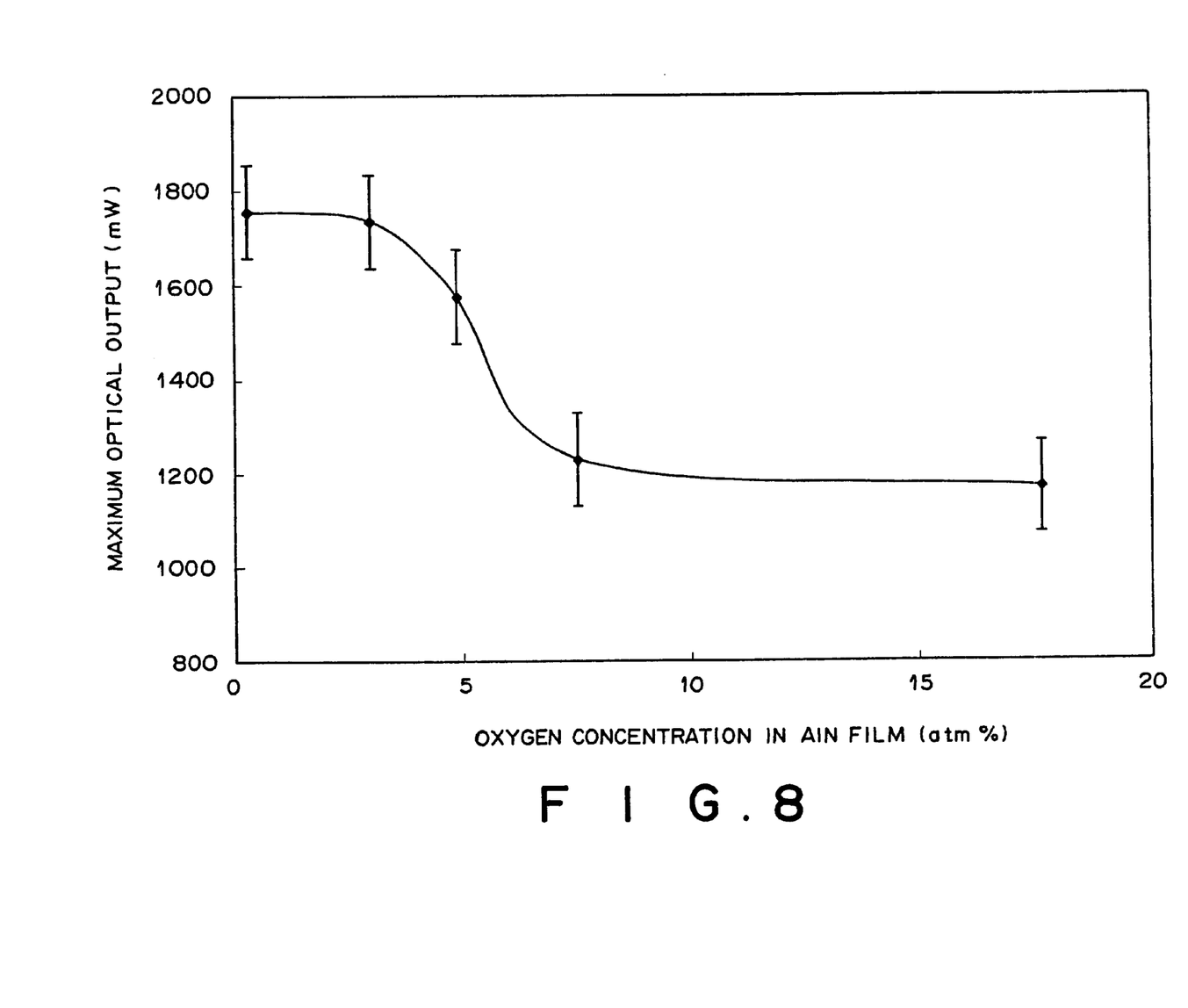
FIG. 8 is a graph indicating a relationship between the maximum optical output and the oxygen concentration in the AlN film.

FIG. 8 is a graph indicating a relationship between the maximum optical output and the oxygen concentration in the AlN film. As illustrated in FIG. 8, the maximum optical output increases with decrease in the oxygen concentration. When the oxygen concentration is 5 atm % or below, the maximum optical output can exceed 1,600 mW, while the maximum optical output is 1,200 mW with the oxygen concentration of 15 atm %.

Figure 9:
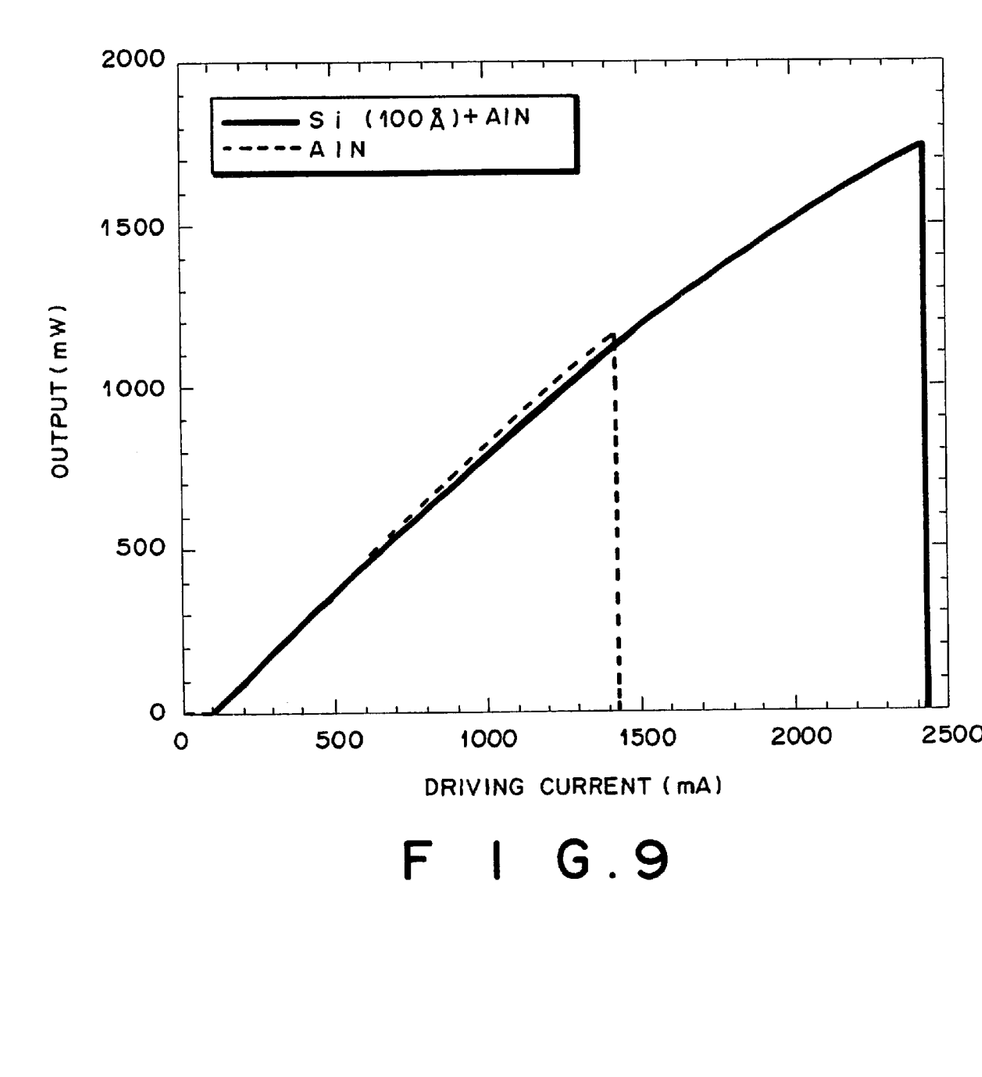
FIG. 9 is a graph indicating a relationship between an optical output and a driving current in each of the conventional semiconductor laser element and a semiconductor laser element according to the present invention.

FIG. 9 is a graph indicating a relationship between an optical output and a driving current in each of the conventional semiconductor laser element and a semiconductor laser element according to the present invention. In FIG. 9, the solid curve indicates the relationship between the optical output and the driving current in the semiconductor laser element according to the present invention in which the Si film has a thickness of 10 nm, and the AlN film has an oxygen concentration of 2.96 atm %; and the dashed curve indicates the relationship between the optical output and the driving current in the conventional semiconductor laser element in which the AlN film has an oxygen concentration of 17.6 atm %. As illustrated in FIG. 9, in the case where the light exit end surface of the semiconductor laser element is coated with the Si film and the AlN film, the optical output power reaches the maximum of 1,750 mW when the driving current is 2,500 mA; while in the case where the light exit end surface of the semiconductor laser element is coated with only the AlN film, the maximum optical output power is merely 1,000 mW with the driving current of 1,500 mA. That is, the maximum output power is increased by the provision of the present invention.

Second Embodiment

Figure 10:
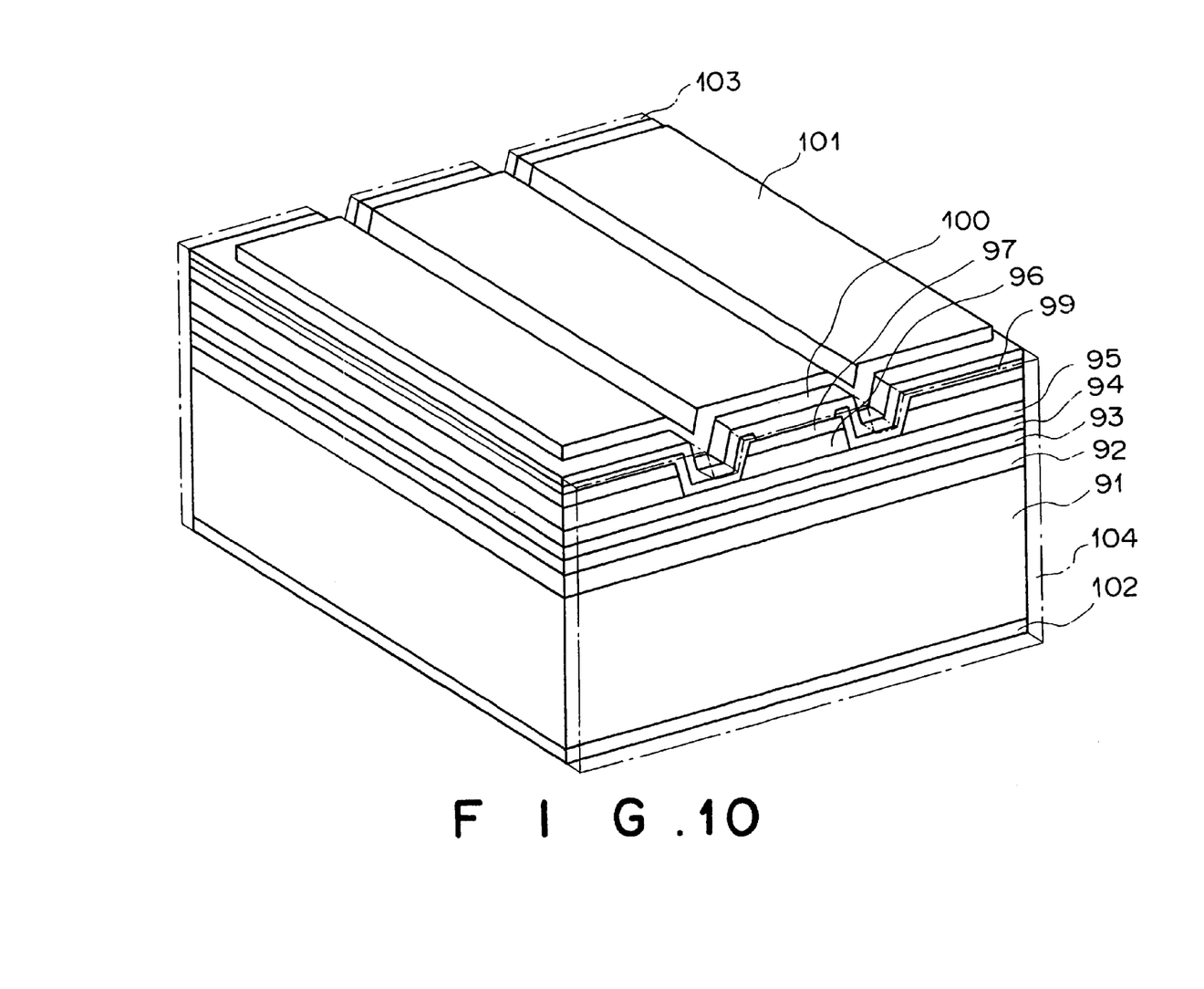
FIG. 10 is a perspective view of a semiconductor laser element as the second embodiment of the present invention.

FIG. 10 is a perspective view of a semiconductor laser element as the second embodiment of the present invention. The construction of FIG. 10 corresponds to a single semiconductor laser element, which is obtained by cleaving a bar as illustrated in FIG. 2 into pieces. In practice, a plurality of layered structures each corresponding to a semiconductor laser element are concurrently formed on a substrate. Then, the substrate on which the above plurality of layered structures are formed is cleaved into a plurality of bars each of which has the construction as illustrated in FIG. 2.

However, for the sake of simplicity of illustration, the formation of the plurality of constructions on the substrate is explained below with reference to FIG. 10.

As illustrated in FIG. 10, an n-type $In_{0.49}(Ga_{1-z1}Al_{z1})_{0.51}P$ lower cladding layer 92 ($0 \leq z1 \leq 0.5$), an i-type $In_{x2}Ga_{1-x2}As_{1-y2}P_{y2}$ lower optical waveguide layer 93 ($x2 \approx_{0.49} y2, 0.1 \leq y1 \leq 0.9$) having a thickness db of 75 to 400 nm, an $In_{x3}Ga_{1-x3}As_{1-y3}P_{y3}$ quantum well active layer 94 ($0 \leq x3 \leq 0.4, 0 \leq y3 \leq 0.6$), an i-type $In_{x2}Ga_{1-x2}As_{1-y2}P_{y2}$ upper optical waveguide layer 95 ($x2 \approx_{0.49} y2, 0.1 \leq y1 \leq 0.9$) having a thickness db of 75 to 400 nm, a p-type $In_{0.49}(Ga_{1-z1}Al_{z1})_{0.51}P$ upper cladding layer 96, and a p-type GaAs contact layer 97 are formed on an n-type GaAs substrate 91. Then, a $SiO_2$ insulation film 98 (not shown) is formed over the layered structures formed as above.

Thereafter, a ridge stripe structure having a width of about 30 to 250 μm is formed as follows. First, two stripe areas of the $SiO_2$ insulation film 98, located on both sides of the ridge stripe structure, are removed by normal lithography, and then portions of the above layered structure under the two stripe areas are removed to the depth of the upper boundary of the i-type $In_{x2}Ga_{1-x2}As_{1-y2}P_{y2}$ upper optical waveguide layer 95, by wet etching using the above $SiO_2$ insulation film 98 as a mask and a solution of sulfuric acid and hydrogen peroxide as an etchant. Due to the use of the solution of sulfuric acid and hydrogen peroxide as an etchant, the wet etching automatically stops at the upper boundary of the i-type $In_{x2}Ga_{1-x2}As_{1-y2}P_{y2}$ upper optical waveguide layer 95.

Next, the remaining portions of the $SiO_2$ insulation film 98 are removed, and then another $SiO_2$ insulation film 99 is formed over the entire surface of the above layered structure. Thereafter, a portion of the $SiO_2$ insulation film 99 located on the top of the ridge stripe structure is removed along the ridge stripe so as to form a current injection window. Then, a p electrode 100 is formed over the entire area of the current injection window, and the p electrode 100 is coated with Au plating 101 having a thickness of 5 μm or more. Finally, the bottom surface of the n-type GaAs substrate 91 is polished, and an n electrode 102 is formed on the polished surface.

Each layer in the layered structure illustrated in FIG. 10 may be formed by molecular beam epitaxy using solid or gas raw material.

Thereafter, the substrate on which the above plurality of layered structures are formed are cleaved into a plurality of bars each of which has the construction as illustrated in FIG. 2, and a reflectance control layer is formed on a resonator surface of each bar by using the sputtering system in a similar manner to the first embodiment.

The wavelength λ of light emitted by the semiconductor laser element of FIG. 10 can be controlled in the range between 750 and 1,100 nm by appropriately adjusting the composition of the $In_{x3}Ga_{1-x3}As_{1-y3}P_{y3}$ quantum well active layer 4 ($0 \leq x3 \leq 0.4, 0 \leq y3 \leq 0.6$).

Additional Matters (i) The present invention is not limited to the above embodiments, and can be applied to other semiconductor laser elements having different constructions and compositions. That is, the present invention can be applied to semiconductor laser elements which are made of group III–V compounds. Typical examples of the group III–V compounds are InGaN materials realizing oscillation wavelengths of 360 to 500 nm, ZnSSe materials realizing oscillation wavelengths of 410 to 540 nm, InGaAlP materials realizing oscillation wavelengths of 600 to 730 nm, AlGaAs materials realizing oscillation wavelengths of 750 to 870 nm, InGaAsP materials realizing oscillation wavelengths of 700 to 1,200 nm and 1,300 to 1,900 nm, InGaAs materials realizing oscillation wavelengths of 950 to 1,200 nm and 1,300 to 1,900 nm, and InGaSb materials realizing oscillation wavelengths of 1.8 to 3.0 μm, where "XY materials" means materials which contains at least the elements X and Y when each of X and Y is a symbol of an element.

(ii) In addition, all of the contents of Japanese Patent Application No. 11(1999)-243113 are incorporated into this specification by reference.

What is claimed is:

1. A semiconductor laser element comprising:
   a multilayered structure being formed of a plurality of semiconductor layers made of a plurality of group III–V compounds, and having at least a pair of cleaved end surfaces as a pair of light resonator surfaces;
   a first reflectance control layer formed on at least one of said pair of light resonator surfaces, and made of an oxygen gettering material which has a function of gettering oxygen; and
   a second reflectance control layer formed on said first reflectance control layer, and made of a nitride of a group III material.

2. A semiconductor laser element according to claim 1, wherein said group III material is one or more of B, Al, In, and Ga.

3. A semiconductor laser element according to claim 1, wherein said first reflectance control layer has such a thickness that said second reflectance control layer has an oxygen concentration of 5 atm % or below.

4. A semiconductor laser element according to claim 3, wherein said group III material is one or more of B, Al, In, and Ga.

5. A semiconductor laser element according to claim 1, wherein said first reflectance control layer has such a thickness that said second reflectance control layer has an oxygen concentration of 3 atm % or below.

6. A semiconductor laser element according to claim 5, wherein said group III material is one or more of B, Al, In, and Ga.

7. A semiconductor laser element according to claim 1, wherein said oxygen gettering material is one or a mixture of group IV elements, one or a mixture of group V elements, or one or a mixture of other metallic elements.

8. A semiconductor laser element according to claim 7, wherein said group III material is one or more of B, Al, In, and Ga.

9. A semiconductor laser element according to claim 7, wherein said group IV elements are Si and Ge.

10. A semiconductor laser element according to claim 9, wherein said group III material is one or more of B, Al, In, and Ga.

11. A semiconductor laser element according to claim 9, wherein said thickness of the first reflectance control layer is within a range of 0.2 nm and 50 nm.

12. A semiconductor laser element according to claim 11, wherein said group III material is one or more of B, Al, In, and Ga.

13. A semiconductor laser element according to claim 7, wherein said group V elements are Sb and Bi.

14. A semiconductor laser element according to claim 13, wherein said group III material is one br more of B, Al, In, and Ga.

15. A semiconductor laser element according to claim 13, wherein said thickness of the first reflectance control layer is within a range of 0.2 nm and 50 nm.

16. A semiconductor laser element according to claim 15, wherein said group III material is one or more of B, Al, In, and Ga.

17. A semiconductor laser element according to claim 7, wherein said other metallic elements are Al, Ti, V, Ta, Cr, and Mn.

18. A semiconductor laser element according to claim 17, wherein said group III material is one or more of B, Al, In, and Ga.

19. A semiconductor laser element according to claim 17, wherein said thickness of the first reflectance control layer is within a range of 0.2 nm and 5 nm.

20. A semiconductor laser element according to claim 19, wherein said group III material is one or more of B, Al, In, and Ga.

* * * * *